(12) United States Patent
Lee et al.

(10) Patent No.: US 12,733,318 B2
(45) Date of Patent: Sep. 8, 2026

(54) LIGHT EMITTING DIODE MODULE AND METHOD FOR MANUFACTURING LIGHT EMITTING DIODE MODULE

(71) Applicant: SAMSUNG ELECTRONICS CO., LTD., Suwon-si (KR)

(72) Inventors: Changjoon Lee, Suwon-si (KR); Seongho Son, Suwon-si (KR); Jongsung Lee, Suwon-si (KR); Wonsoon Park, Suwon-si (KR); Donghun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 585 days.

(21) Appl. No.: 18/076,985

(22) Filed: Dec. 7, 2022

(65) Prior Publication Data

US 2023/0103123 A1 Mar. 30, 2023

Related U.S. Application Data

(63) Continuation of application No. PCT/KR2021/005603, filed on May 4, 2021.

(30) Foreign Application Priority Data

Jun. 22, 2020 (KR) ........................ 10-2020-0076055

(51) Int. Cl.
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC .... H01L 25/0753; H10H 29/24; H10H 29/49; H10H 29/857; H10H 20/857; H10H 29/8508
See application file for complete search history.

(56) References Cited

U.S. PATENT DOCUMENTS 6,970,336 B2 11/2005 Stockinger et al.
2007/0210317 A1* 9/2007 Chou .................... H01L 25/167 257/E33.076
2007/0236847 A1 10/2007 Jiang et al.
2011/0155423 A1 6/2011 Aono
(Continued)

FOREIGN PATENT DOCUMENTS

EP 3 270 413 A1 1/2018
JP 5114569 B2 1/2013
(Continued)

OTHER PUBLICATIONS

Written Opinion (PCT/ISA/237) issued Aug. 23, 2021 by the International Searching Authority in International Application No. PCT/KR2021/005603.
(Continued)

*Primary Examiner* — Kevin Parendo
(74) *Attorney, Agent, or Firm* — Sughrue Mion, PLLC

(57) ABSTRACT

A light emitting diode (LED) module includes: a substrate; a plurality of first electrodes arranged on a top surface of the substrate; a second electrode provided on the top surface of the substrate among the plurality of first electrodes; and an LED electrically connected to the plurality of first electrodes.

13 Claims, 11 Drawing Sheets

(56) References Cited

U.S. PATENT DOCUMENTS

| | | | | |
|---|---|---|---|---|
| 2014/0084312 | A1 | 3/2014 | Huang et al. | |
| 2014/0159072 | A1* | 6/2014 | Ooyabu | H01L 24/97 174/261 |
| 2014/0340363 | A1 | 11/2014 | Ikeda et al. | |
| 2017/0271398 | A1* | 9/2017 | Oh | H10D 86/411 |
| 2018/0026074 | A1 | 1/2018 | Lee et al. | |
| 2019/0373723 | A1* | 12/2019 | Tsai | H10H 20/857 |
| 2021/0288220 | A1 | 9/2021 | Oh et al. | |

FOREIGN PATENT DOCUMENTS

| | | | |
|---|---|---|---|
| JP | 2015-5280 | A | 1/2015 |
| KR | 10-2004-0029385 | A | 4/2004 |
| KR | 10 2018 0032355 | A | 3/2018 |
| KR | 10-2019-0138578 | A | 12/2019 |
| KR | 10-2020-0037906 | A | 4/2020 |
| WO | 2020/017712 | A1 | 1/2020 |

OTHER PUBLICATIONS

Search Report (PCT/ISA/210) issued Aug. 23, 2021 by the International Searching Authority in International Application No. PCT/KR2021/005603.

Communication issued on Oct. 11, 2023 by the European Patent Office for European Patent Application No. 21829611.9.

Communication issued Dec. 11, 2024 by the Korean Intellectual Property Office in Korean Patent Application No. 10-2020-0076055.

Communication dated Jun. 18, 2016 issued by the China National Intellectual Property Administration in Chinese Patent Application No. 202180044120.X.

* cited by examiner

LIGHT EMITTING DIODE MODULE AND METHOD FOR MANUFACTURING LIGHT EMITTING DIODE MODULE

CROSS-REFERENCE TO RELATED APPLICATIONS

This application is a by-pass continuation application of International Application No. PCT/KR2021/005603, filed on May 4, 2021, which based on and claims priority to Korean Patent Application No. 10-2020-0076055, filed on Jun. 22, 2020, in the Korean Intellectual Property Office, the disclosures of which are incorporated by reference herein in their entireties.

BACKGROUND

1. Field

The disclosure relates to a light emitting diode (LED) module equipped with an LED device and method for manufacturing the LED module.

2. Description of Related Art

Display apparatuses may include a light receiving display panel such as a liquid crystal display (LCD) and a self-lighting display panel that produces light corresponding to a data signal.

To implement the self-lighting display panel in particular, studies on light emitting diodes (LEDs) which are inorganic light emitting devices are ongoing actively. LEDs use characteristics of compound semiconductors to convert an electric signal into the form of light such as infrared rays, visible rays, etc., and are used not only for home appliances, remote controls, billboards or various automation devices but also for more extensive areas such as small hand-held electronic devices or large display device. As development of micro LED displays by miniaturizing the LED becomes active, the LED is implemented in the form of a modular display these days.

SUMMARY

Provided are a light emitting diode (LED) module and method for manufacturing the LED module to prevent damage to the LED module caused by static electricity by implementing electrodes on an outer side of the LED module where a wiring layer is arranged.

According to an aspect of the disclosure, a light emitting diode (LED) module includes: a substrate; a plurality of first electrodes arranged on a top surface of the substrate; a second electrode provided on the top surface of the substrate among the plurality of first electrodes; and an LED electrically connected to the plurality of first electrodes.

The plurality of first electrodes may be arranged in an array in a first area on the top surface of the substrate, and the second electrode may be provided in the first area and in a second area on the top surface of the substrate outside the first area.

The second electrode may include a protruding portion extending from the top surface of the substrate in the second area, and a height of the protruding portion may be higher than heights of the plurality of first electrodes and lower than or equal to a height of the LED.

The protruding portion of the second electrode may be formed by grinding the second electrode in the second area along with a corner of the substrate.

The plurality of first electrodes may be arranged in a two-dimensional array on the top surface of the substrate, and the second electrode may have a mesh form on the top surface of the substrate.

The substrate may include a signal wiring layer comprising a lower signal electrode and a lower power electrode, the plurality of first electrodes may be electrically connected to the lower signal electrode, and the second electrode may be electrically connected to the lower power electrode.

The substrate may have a rectangular form having four sides surrounding the top surface and a bottom surface of the substrate, the substrate may include side wires provided on at least one side among the four sides of the substrate to electrically connect electrodes arranged on the top surface and the bottom surface of the substrate, and the second electrode may be provided among the plurality of first electrodes and the side wires.

The second electrode may have a capacitance that is greater than a capacitance of the plurality of first electrodes.

According to an aspect of the disclosure, a light emitting diode (LED) module includes: a substrate; a plurality of first electrodes arranged in an array on a top surface of the substrate; a second electrode provided among the array of the plurality of first electrodes on the top surface of the substrate; and an LED electrically connected to the plurality of first electrodes, wherein the second electrode comprises a protruding portion extending from the top surface of the substrate in an area outside the array, and wherein a height of the protruding portion is higher than a height of the plurality of first electrodes and lower than or equal to a height of the LED.

The protruding portion of the second electrode may be formed by grinding the second electrode arranged in the area outside the array along with a corner of the substrate.

The substrate may include a signal wiring layer comprising a lower signal electrode and a lower power electrode, the plurality of first electrodes may be electrically connected to the lower signal electrode, and the second electrode may be electrically connected to the lower power electrode.

The substrate may be provided in a rectangular form having four sides surrounding the top surface and bottom surface of the substrate, the substrate may include side wires arranged at least one side among the four sides of the substrate to electrically connect electrodes arranged on the top surface and the bottom surface of the substrate, and the second electrode is provided among the plurality of first electrodes and the side wires.

The second electrode may have capacitance that is greater than a capacitance of the plurality of first electrodes.

According to an aspect of the disclosure, a light emitting diode (LED) module includes: a substrate; a plurality of first electrodes two-dimensionally arranged on a top surface of the substrate; a second electrode provided in a mesh form among the plurality of first electrodes on the top surface of the substrate; and an LED electrically connected to the plurality of first electrodes.

The plurality of first electrodes may be arranged in an array in a first area on the top surface of the substrate, and the second electrode may be provided in the first area and a second area on the top surface of the substrate outside the array.

The protruding portion of the second electrode is formed by grinding the second electrode arranged in the second area outside the array along with a corner of the substrate.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
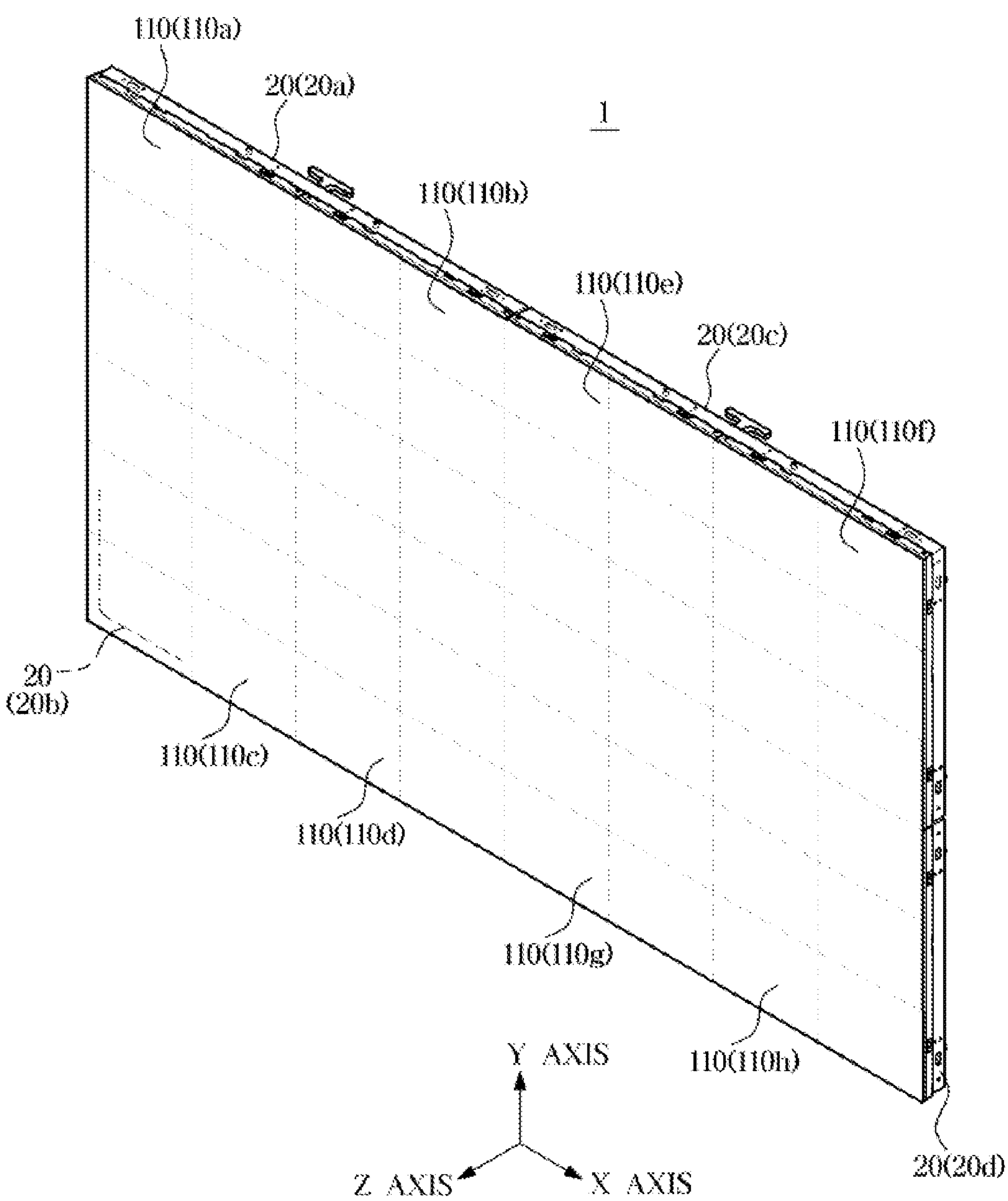
FIG. 1 illustrates an exterior of a display apparatus, according to an embodiment of the disclosure.

Like numerals refer to like elements throughout the specification. Not all elements of embodiments of the disclosure will be described, and description of what are commonly known in the art or what overlap each other in the embodiments will be omitted. The term 'unit, module, member, or block' may refer to what is implemented in software or hardware, and a plurality of units, modules, members, or blocks may be integrated in one component or the unit, module, member, or block may include a plurality of components, depending on the embodiment of the disclosure.

It will be further understood that the term "connect" or its derivatives refer both to direct and indirect connection, and the indirect connection includes a connection over a wireless communication network.

The term "include (or including)" or "comprise (or comprising)" is inclusive or open-ended and does not exclude additional, unrecited elements or method steps, unless otherwise mentioned.

Throughout the specification, when it is said that a member is located "on" another member, it implies not only that the member is located adjacent to the other member but also that a third member exists between the two members.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section.

It is to be understood that the singular forms "a," "an," and "the" include plural references unless the context clearly dictates otherwise.

Reference numerals used for method steps are just used for convenience of explanation, but not to limit an order of the steps. Thus, unless the context clearly dictates otherwise, the written order may be practiced otherwise.

The principle and embodiments of the disclosure will now be described with reference to accompanying drawings.

FIG. 1 illustrates an exterior of a display apparatus including a light emitting diode (LED) module, according to an embodiment of the disclosure.

In FIG. 1, X-, Y-, and Z-axes perpendicular to one another are shown, where the X-axis represents a left-to-right direction, the Y-axis represents a vertical direction, and the Z-axis represents a front-to-back direction.

A display apparatus 1 may be a device for displaying information, materials, data, etc., in characters, figures, graphs, images, etc., and may be implemented as an advertising board, an electronic signage, a screen, a television, a monitor, etc. The display apparatus may be installed on the wall or the ceiling, or on the indoor or outdoor ground by means of a stand.

The display apparatus 1 may include an LED module 110 for displaying a screen, and a frame 20 coupled to the rear side of the LED module 110 for supporting the LED module 110.

Figure 2A:
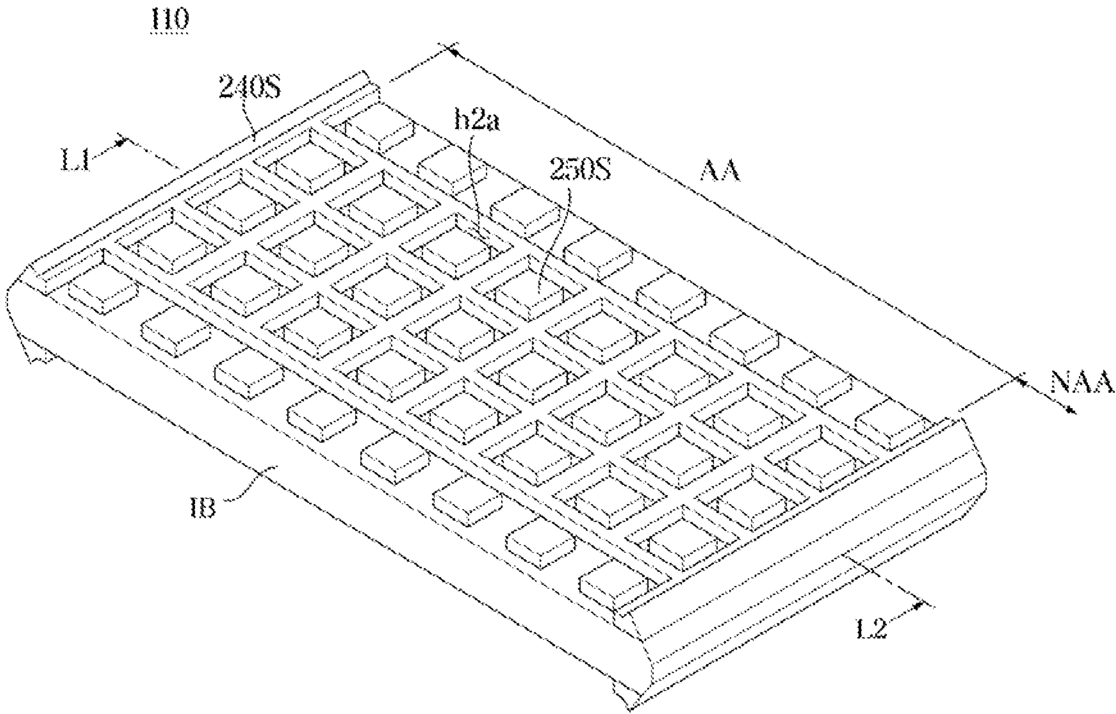
FIG. 2A is a perspective view of a light emitting diode (LED) module, according to an embodiment.
Figure 2B:
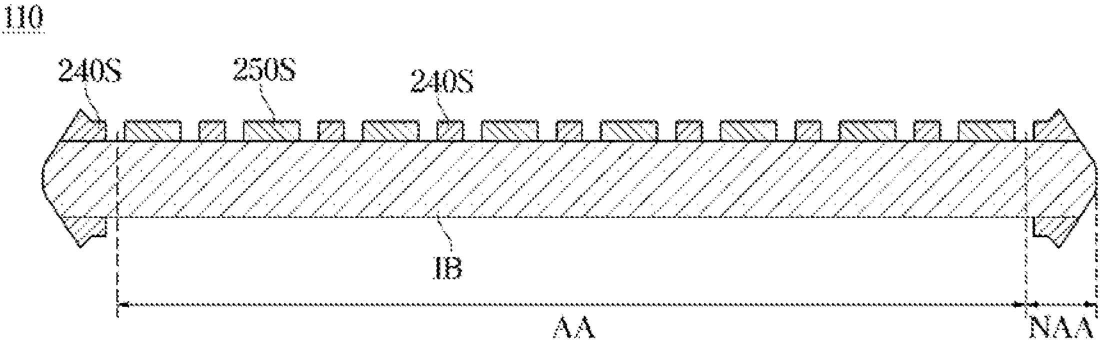
FIG. 2B is a side view of an LED module, according to an embodiment

FIG. 2A is a perspective view of the LED module 110, according to an embodiment, and FIG. 2B is a side view of another LED module, according to an embodiment.

Referring to FIGS. 2A and 2B, provided is a substrate IB on which upper signal electrodes 250S and an upper power electrode 240S are arranged. The substrate IB may refer to a substrate structure including glass and a signal wiring layer, which will be described later. The term 'upper signal electrodes' 250S as herein used may correspond to a plurality of first electrodes, and the term 'upper power electrode' 240S may correspond to a second electrode. The terms 'first electrode' 250S and the 'second electrode' 240S are to distinguish between the electrodes but are not to limit functions of the electrodes. The plurality of first electrodes (e.g., the upper signal electrodes) 250S may be arranged in an area on the top surface of the substrate. For example, the plurality of first electrodes 250S may be arranged in two dimensions (N×M). For example, N and M can be the same or different numbers, such as 2, 3, . . . On the other hand, the second electrode (e.g., the upper power electrode) 240S may be arranged on the top surface of the substrate where the first electrodes are not arranged.

The second electrode 240S may be spread on the substrate and formed into a layer structure. Unlike the first electrode, the second electrode 240S may form planes between the first electrodes to form the layer structure. In other words, the second electrode 240S may be formed in the form of a layer having a mesh structure including a plurality of openings h2*a*. The mesh structure may refer to a mesh form including a plurality of openings. The first electrodes may be arranged on the top surface of the substrate corresponding to the plurality of openings of the second electrode 240S.

FIG. 2B is a cross-sectional view of L1 and L2 of FIG. 2A. Each upper signal electrode 250S and the upper power electrode 240S may be connected to a signal wiring layer arranged on the LED module. The upper signal electrodes 250S may be provided as electrodes for outputting respective pixel signals after the LED module is completed.

The upper power electrode 240S and the upper signal electrodes 250S may be provided to be electrically opened during a process, i.e., when the power is not supplied thereto. The upper signal electrode 250S may include a plurality of sub-signal electrodes connected to an LED. The sub-signal electrode included in the upper signal electrode 250S may be connected to the LED to send a signal to the LED.

Furthermore, the upper power electrode 240S may be arranged in at least a portion of outermost edges of the substrate IB. In FIG. 2A, the upper power electrode 240S is shown as being arranged on the outermost edge along a long axis of the LED module. The LED module 110 may form an array 'AA' of the plurality of upper signal electrodes 250S.

The upper power electrode 240S may be arranged in a portion of an area 'NAA' outside the array 'AA.' The array 'AA' may refer to an area in which the upper signal electrodes are arranged in rows and columns. Furthermore, the outside area 'NAA' may refer to a different area from the array 'AA,' in which the upper power electrode 240S is arranged.

Referring to FIG. 2B, the LED module may be subject to a chamfering process to prevent glass breaking. The chamfering process may refer to a process of forming round corners by grinding corners of the substrate. There is no limitation to operation of the chamfering process as long as the operation may form the round corners of the substrate.

Specifically, a protruding portion (projection) of the upper power electrode 240S may be formed by grinding the upper power electrode 240S arranged on the edge of the substrate and the substrate corner together. The corner and the upper power electrode 240S are ground substantially together, for example, the substrate and the upper power electrode 240S may be ground at the same time or with a time difference. Furthermore, there is no limitation to the grinding order. For example, grinding of the substrate may be followed by grinding of the upper power electrode 240S, or on the contrary, grinding of the upper power electrode 240S may be followed by grinding of the substrate.

When the upper power electrode 240S is on the outermost area of the LED module during the chamfering process, the protruding portion (projection) may be formed at the power electrode due to a difference in hardness between materials.

The protruding portion (projection) formed may have a structure that is effective in attracting electrostatic discharge (ESD) to the power electrode, as will be described later. This will be described later in detail.

The structure of the LED module as described above in connection with FIGS. 2A and 2B is merely an embodiment of the disclosure, and there is no limitation to the structure as long as the structure has the power electrode formed on the edge of the LED module.

Figure 3:
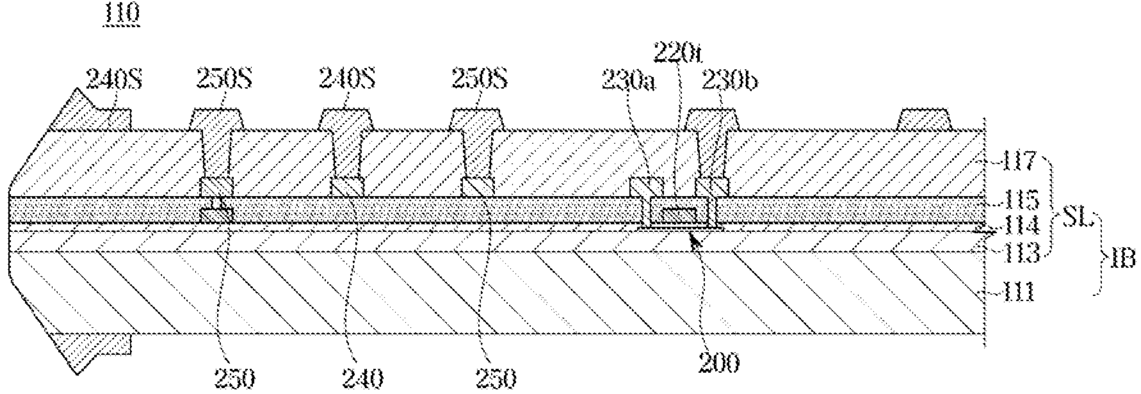
FIGS. 3 to 4 illustrate a procedure for manufacturing an LED module, according to an embodiment.
Figure 4:
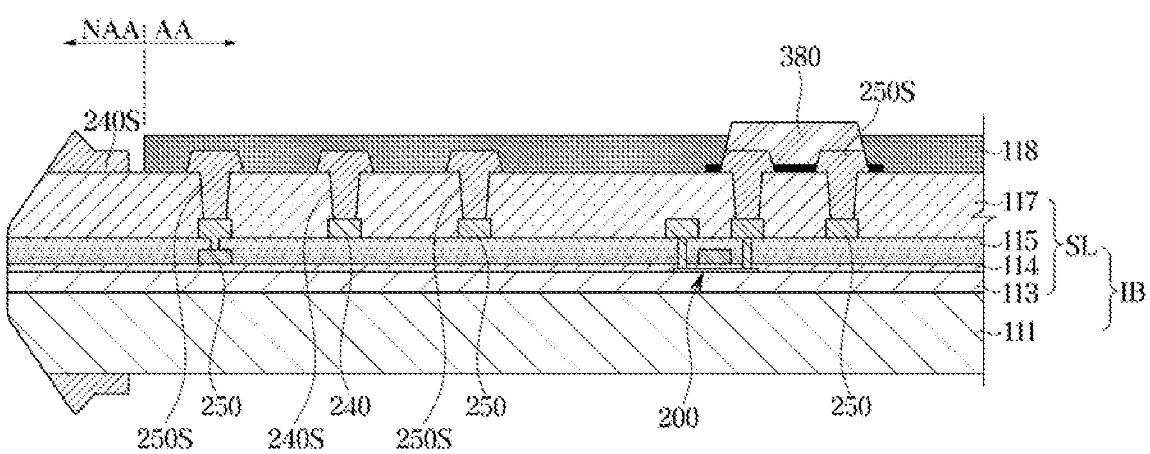
Figure 5:
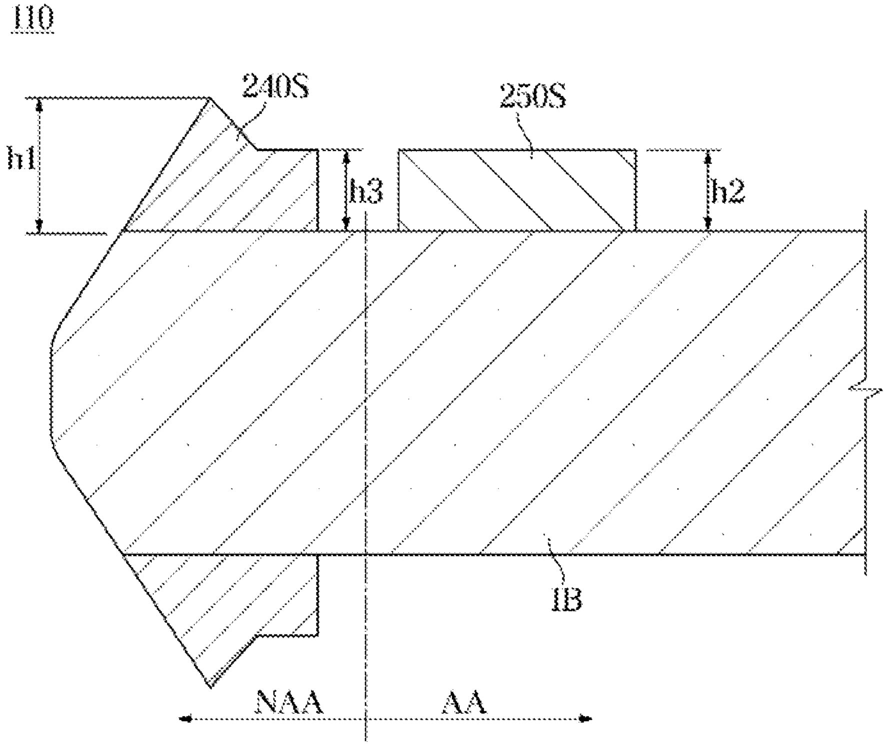
FIG. 5 illustrates a protruding portion (protruding form or projection) of a power electrode, according to an embodiment

FIGS. 3 to 5 are diagrams for describing a procedure for manufacturing an LED module, according to an embodiment. As shown in FIG. 3, glass 111 may be stacked. On the glass 111, a signal wiring layer SL including multiple layers may be arranged.

The glass and the signal wiring layer may form the substrate IB. A lower power electrode 240 may be electrically connected to the upper power electrode 240S. The upper power electrode 240S may be arranged in an outermost area of the signal wiring layer SL. The upper power electrode 240S may also be arranged between the upper signal electrodes 250S. The upper power electrode 240S may be arranged in the outside area 'NAA' of the LED module 110 to absorb the ESD.

Furthermore, the upper power electrode 240S may be connected to the lower power electrode 240. The lower power electrode 240 may be connected to a ground electrode to induce the ESD brought in through the upper power electrode 240S not to affect other signal electrodes in the signal wiring layer SL.

Furthermore, the upper power electrode 240S may form protruding portions (projections) in the chamfering process. A height of the protruding portion (projection) formed from the upper power electrode 240S may exceed the height of other upper signal electrodes. This will be described later in detail.

Referring to FIG. 4, an LED 380 may be mounted on the LED module. When the LED is included, a second insulation layer 118 may be stacked. When the second insulation layer 118 is to be stacked, the upper power electrode 240S arranged in the outermost area of the LED module 110 is formed as the protruding portion (projection), so the second insulation layer 118 may be formed not to be stacked in the area.

That is, the second insulation layer may be stacked in the array area 'AA' formed in the disclosure. In other words, the second insulation layer may not be stacked in the outside area 'NAA' corresponding to the upper power electrode 240S but may be stacked in the array area 'AA.'

Even in the subsequent process, ESD may be induced to the upper power electrode 240S and may exit through the ground. The glass 111 may include a light emitting area in which the LED 380 is arranged to emit light, and a non-light emitting area in which a circuit element such as a thin-film transistor (TFT) 200 is arranged and no light is emitted. In the non-light emitting area of the glass 111, a light absorption layer may be arranged to absorb external light and improve visibility.

The LED 380 may be provided as an inorganic LED. Specifically, the LED 380 is an LED having a size of 10 to 100 μm, which may be provided by growing an inorganic material such as AL, Ga, N, P, AS In, etc., in multiple thin films on a sapphire substrate or a silicon substrate and then cutting the sapphire substrate or the silicon substrate into separate pieces.

Furthermore, the LED 380 may be electrically connected to some of the upper signal electrodes 250S and the upper power electrode 240S. The light absorption layer may include a black inorganic material, a black organic material, a black metal, etc., which absorbs light well. For example, the light absorbing material may be formed with such a material as a carbon black, polyene pigment, azo pigment, azomethine pigment, diammonium pigment, phthalocyanine pigment, quinone pigment, indigo pigment, thioindigo pigment, dioxadine pigment, quinacridone pigment, isoindolinone pigment, metal oxide, metal complex, aromatic hydrocarbon, etc.

As shown in FIG. 4, a buffer layer 113 may be arranged on the glass 111. The buffer layer 113 may provide a flat surface on the top of the glass 111, and block a foreign material or moisture from permeating through the glass 111. For example, the buffer layer 113 may contain an inorganic material such as silicon oxide, silicon nitride, silicon oxynitride, aluminum oxide, aluminum nitride, titanium oxide or titanium nitride, or an organic material such as polyimide, polyester or acrylic, and may be provided as a laminate of some of the materials listed.

Referring to FIG. 4, the LED module 110 in an embodiment may include a signal wiring layer. The signal wiring layer SL is a TFT substrate, and in a pixel area (P) on the top surface, a TFT and various wires to drive the LED device 110 may be arranged.

When the TFT is turned on, a driving signal input from the outside through the wires is applied to the LED device 110, so that the LED device 110 may emit light to form an image. The signal wiring layer SL in which the gate electrode **220*t*, a lower signal electrode 250 and the lower power electrode 240, and the LED 380 are connected may be provided in a first insulation layer 117 and a second insulation layer 118**.

Referring to FIG. 4, the TFT 200 and the LED 380 may be equipped on the buffer layer 113. The TFT 200 may include a semiconductor active layer, a gate electrode, a source electrode, and a drain electrode. The semiconductor active layer may contain a semiconductor material, and may have a source region, a drain region, and a channel region between the source region and the drain region. The gate electrode may be provided on the active layer to correspond to the channel region. The source electrode and the drain electrode may be electrically connected to the source region and the drain region in the active layer, respectively.

In a process of manufacturing the LED module, the TFT 200 is turned off, electrically blocking the signal electrode and the power electrode as will be described later. Accordingly, the upper signal electrode and the upper power electrode 240S connected to the signal electrode and the power electrode may also be electrically blocked.

A gate insulation layer 114 may be arranged between the active layer and the gate electrode. The gate insulation layer 114 may be provided with an inorganic insulation material. An inter-layer insulation layer 115 may be arranged between the gate electrode and the source electrode and between the gate electrode and the drain electrode. The inter-layer insulation layer 115 may be formed of an organic insulation material or an inorganic insulation material, or may be formed by alternating the organic insulation material and the inorganic insulation material. The first insulation layer 117 is arranged on the source electrode and the drain electrode as a flattened film. The first insulation layer 117 may be formed of an organic insulation material or an inorganic insulation material, or may be formed by alternating the organic insulation material and the inorganic insulation material.

Although the TFT 200 is illustrated as being implemented in a top gate type with the gate electrode arranged on the top of the semiconductor active layer in an embodiment of the disclosure, the disclosure is not limited thereto and the gate electrode may be arranged at the bottom of the semiconductor active layer.

As shown in FIG. 4, the LED 380 may be arranged on the first insulation layer 117. In the embodiment of the disclosure, the LED 380 may be a micro LED. The term 'micro' implies a size of 1 to 100 μm, but the disclosure is not limited thereto and may be equally applied to a larger sized or smaller sized LED.

The individual micro LED or multiple micro LEDs may be picked up from the wafer and transferred onto the glass 111 by a feed mechanism. As the micro LED is made of an inorganic material, the micro LED has a fast response speed, low power, and high brightness as compared to an organic LED (OLED) that uses an organic material. Furthermore, while the organic LED requires an encapsulation process because the organic LED is vulnerable to exposure to moisture and oxygen, and has poor durability, the micro LED does not require the encapsulation process and has excellent durability.

The LED 380 may emit light of a certain wavelength that belongs to a wavelength range from ultraviolet light to visible light. For example, the LED 380 may be a red, green, blue, white or UV LED. Specifically, a red LED, a green LED and a blue LED may be arranged in neighboring sub-pixel areas SP, and these three neighboring sub-pixel areas SP may be provided in a single pixel area P. A color may be determined by a mixture of the red light, the green light, and the blue light produced from the single pixel area P.

The LED 380 may include a p-n diode, an anode and a cathode. The anode and/or cathode may be formed of various conductive materials including metals, conductive oxides and conductive polymers. The anode may be electrically connected to the lower signal electrode 250, and the cathode may be electrically connected to a common ground electrode. The p-n diode may include a p-doped portion on the anode side, one or more quantum well portions, and an n-doped portion on the cathode side. Alternatively, the doped portion on the cathode side may be a p-doped portion and the doped portion on the anode side may be an n-doped portion.

The anode and cathode may be located on the top surface of the LED. Alternatively, a light-emitting plane of the LED 380 may be located on the bottom surface of the LED 380. Accordingly, the light-emitting plane of the LED 380 may come into contact with the first insulation layer 117, and the LED 380 may emit light toward the glass 111.

The gate electrode 220*t*, the lower signal electrode 250 and the lower power electrode 240 may be provided in the first insulation layer 117. The signal wiring layer SL in which the gate electrode, the lower signal electrode 250 and the LED are connected may be provided in a first insulation layer 117 and a second insulation layer 118. That is, according to an embodiment of the disclosure, the LED 380 may be of a bottom emission type. As the LED 380 has the bottom emission type, a pixel circuit device such as the TFT 200 and the LED 380 are arranged not to overlap each other in the vertical direction. The LED 380 may be fixed onto the first insulation layer 117 by adhesive coating.

As shown in FIG. 4, the second insulation layer 118 may be provided on the first insulation layer 117 to enclose the LED 380. The second insulation layer 118 may include an organic insulation material. For example, the second insulation layer 118 may be formed of acrylic, polymethyl methacrylate (PMMA), benzocyclobutene (BCB), polyimide, acrylate, epoxy, polyester, etc., without being limited thereto.

The gate electrodes 220*t*, the upper power electrodes 240S and the upper signal electrodes 250S may connect various driver integrated circuits (ICs) for driving the LED module 110 to the pixel circuits. For example, the upper power electrodes 240S and the upper signal electrodes 250S may be connected to the lower power electrode 240 and the lower signal electrode 250, respectively.

The lower power electrode 240 may be connected to Vim (e.g., positive voltage such as 5V or 3.3V) and $V_{SS}$ (e.g., negative voltage such as 0V). The lower power electrode 240 may also be connected to a ground electrode. The ESD brought into the upper power electrode 240S may be eliminated as the lower power electrode 240 is connected to the upper power electrode 240S and the ground electrode.

The upper power electrodes 240S and the upper signal electrodes 250S may include a signal electrode that connects the drain electrode of the TFT 200 to the anode of the LED 380 to apply a data signal to the LED 380, and a common-ground electrode that connects the cathode of the LED 380 to a reference voltage $V_{SS}$ to provide the ground for the LED 380. As the LED 380 is of the bottom emission type, the aforementioned first insulation layer 117, the inter-layer insulation layer 115, the gate insulation layer 114, the buffer layer 113, etc., may all be formed of a transparent material.

In an embodiment, the LED module may be implemented in a top emission type. The top emission type may not limit the configuration of circuits on the substrate and may improve an aperture ratio. The improvement of the aperture ratio may lead to improvement of power consumption efficiency of the LED.

What is described above in connection with FIGS. 3 and 4 is to describe a manufacturing process in which the upper power electrode 240S is arranged in the outer area 'NAA' of the LED module and no layer is stacked on the top of the upper power electrode 240S, but is not limited thereto as long as the LED module has an upper power module arranged on the outermost area of the LED module.

Figure 6:
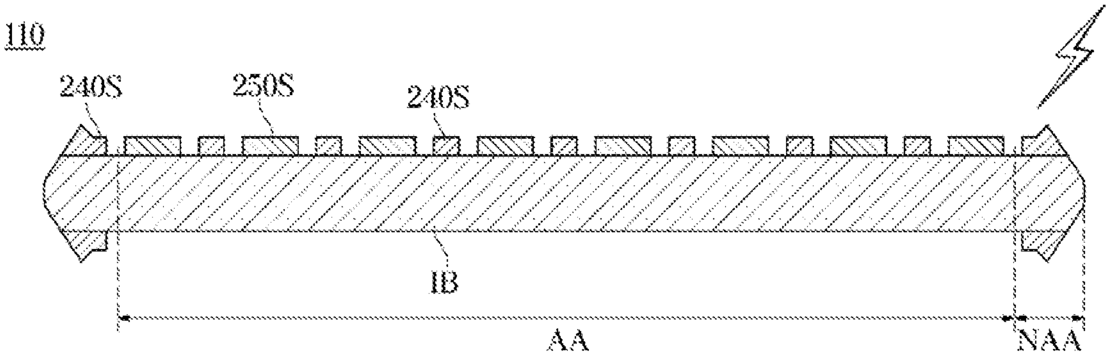
FIG. 6 illustrates a side view of an LED module, according to an embodiment.

FIG. 5 is a diagram for describing a protruding form of a power electrode, according to an embodiment, and FIG. 6 is a diagram for describing a role of an upper power electrode 240S, according to an embodiment. The upper power electrode 240S may form a protruding portion (projection) by being arranged to protrude in the chamfering process.

The protruding portion (projection) is caused by a difference in material of the LED module 110, and may be formed on the top surface of the substrate IB as in the form provided in FIG. 6. In the chamfering process, the upper power electrode 240S may be formed to exceed a predetermined height h1 from the substrate IB. In other words, the upper power electrode 240S may be formed to be higher than the height of the upper signal electrode 250S and lower than or level with the height of the LED.

Specifically, the height h1 of the upper power electrode 240S may be set to exceed a height h2 of the upper signal electrode 250S. Furthermore, a height h3 of the existing upper power electrode 240S may be set to exceed the height h2 of the upper signal electrode 250S. As such, the upper power electrode 240S is set to be high to improve efficiency of ESD induction. Specifically, in the process, ESD is applied to the LED module, the ESD may be induced to the upper power electrode 240S with high capacitance. Especially, the ESD may be induced to the upper power electrode 240S located in the outside area 'NAA.'

The upper power electrode 240S may be provided to have higher capacitance than the upper signal electrode 250S. The capacitance is proportional to the area, and in another embodiment, the area of the upper power electrode 240S may be set to exceed the area of the upper signal electrode 250S.

Furthermore, when the upper power electrode 240S is high, the upper power electrode 240S acts as a lightning rod, which is effective in inducing the ESD. Accordingly, in the chamfering process, the process may be performed for the height of the upper power electrode 240S to exceed a predetermined height. The ESD induced to the upper power electrode 240S may be eliminated through the lower power electrode 240.

In such an operation, the upper power electrode 240S and the upper signal electrode 250S may be connected to the lower power electrode 240 and the lower signal electrode, respectively, arranged in the signal wiring layer SL of the substrate IB. In the manufacturing process, the transistor is turned off, so the lower power electrode 240 and the lower signal electrode may be kept in the electrically opened state. Accordingly, the ESD is induced to the upper signal electrode 250S, and even when going through the lower power electrode 240, may not affect the electrically opened signal electrode. The protruding form of the upper power electrode 240S provided in FIG. 5 is merely an example of a shape formed in the chamfering process and there is no limitation to the shape of the upper power electrode.

Furthermore, FIG. 6 is an example for describing an operation in which the LED module of the disclosure leaks static electricity, and the operation of leaking the static electricity is not limited in the disclosure.

Figure 7:
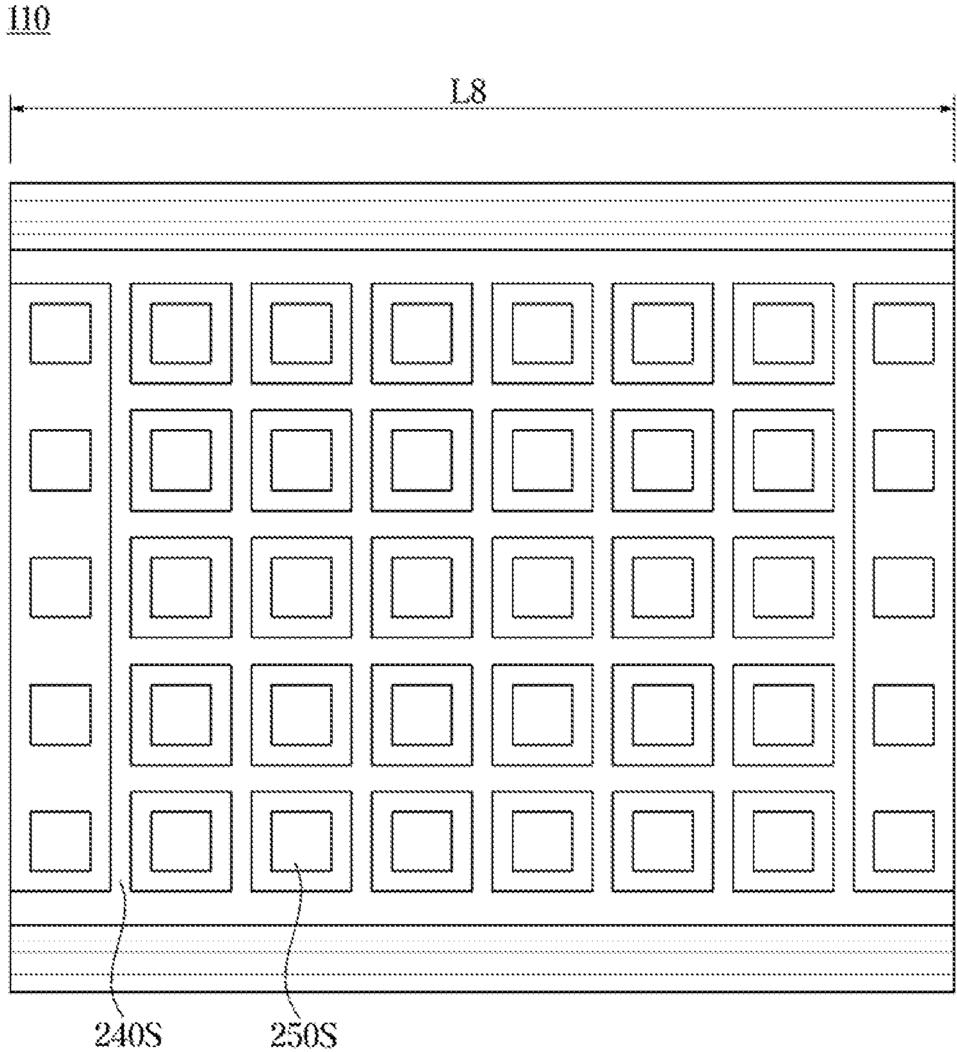
FIGS. 7 to 8 are plan views of an LED module, according to an embodiment.
Figure 8:
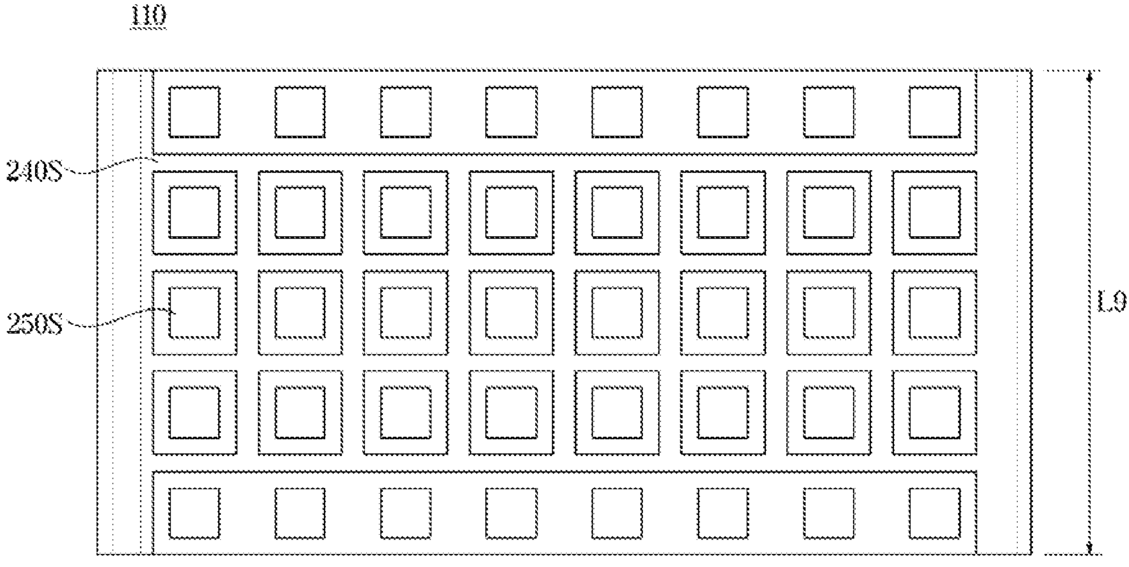

FIGS. 7 and 8 are plan views of the LED module, according to an embodiment. Referring to FIGS. 7 and 8, FIG. 7 shows the upper power electrode arranged on a long axis L8 of the LED module, and FIG. 8 shows the upper power electrode arranged on a short axis L9 of the LED module.

Referring to FIGS. 7 and 8, the upper power electrode 240S may be arranged between or among the upper signal electrodes 250S. The upper power electrode may also be arranged in part of edges of the LED module 110, and FIG. 8 shows the upper power electrode arranged on the long axis L8 of the LED module.

In other words, the LED module 110 may be provided in the form of a rectangle with a pair of planes and four sides surrounding the pair of planes. The signal wiring layer SL corresponding to the LED module 110 may be provided in the rectangular form. Accordingly, the signal wiring layer may include four sides. In this case, the upper power electrode 240S may be arranged in the outside area 'NAA' on two opposite sides among the four sides of the signal wiring layer SL.

Specifically, the upper power electrode 240S may be arranged on at least a first surface of the outer area 'NAA' of the signal wiring layer SL and a second surface of the outer area 'NAA' of the signal wiring layer, which is opposite the first surface. However, as will be described later, the upper power electrode 240S may be arranged in a different form in a situation in which a side wiring structure is taken into account.

Figure 9:
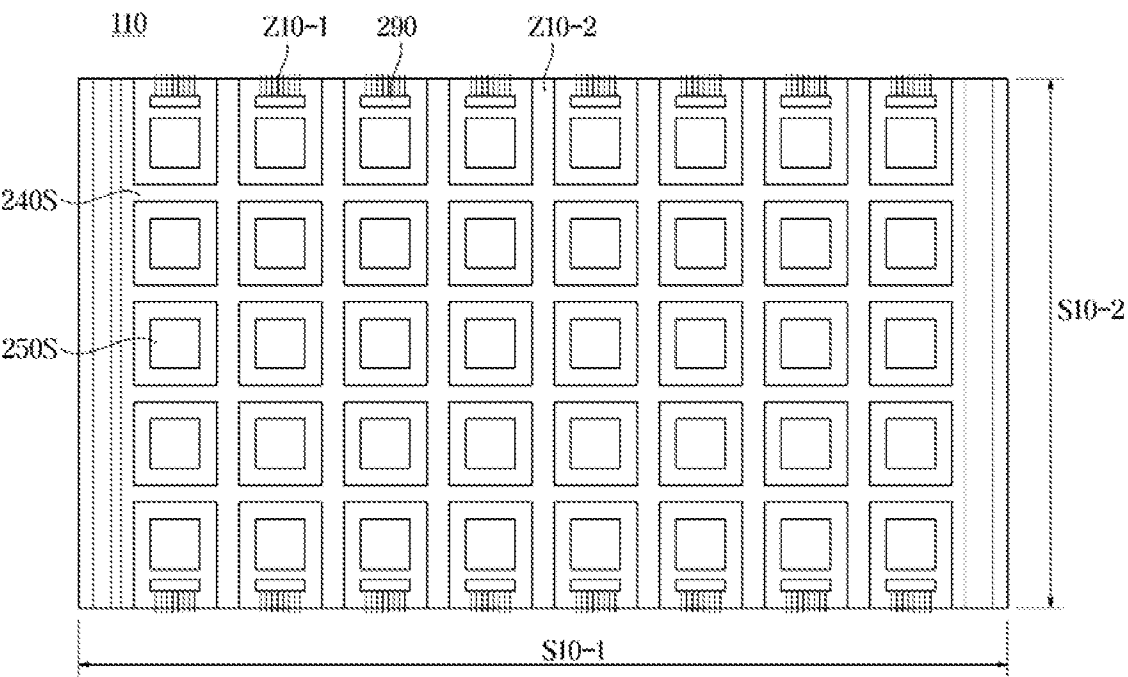
FIG. 9 illustrates a positional relation between a power electrode and side wires, according to an embodiment.

FIGS. 7 and 8 are merely an embodiment and there is no limitation to the form of the upper power electrode 240S. FIG. 9 is a diagram for describing a positional relation between a power electrode and side wires, according to an embodiment.

In an embodiment, the LED module 110 may further include a side wiring structure. The side wiring may refer to a wiring structure in which top and bottom of the LED module 110 are connected.

The upper power electrode 240S may be formed in a space where there is no side wiring. Specifically, the LED module 110 may be equipped with pads 290 connected to the side wires, and the side wires may connect the pad 290 arranged on the top of the LED module 110 to a pad arranged on the bottom. Accordingly, in a space z10-10 where the side wires are arranged, the upper power electrode 240S may not be provided. Hence, in manufacturing the LED module 110, the upper power electrode 240S may be arranged on a different side s10-2 from the side s10-1 on which the side wires are arranged.

However, even on the side s10-1 where the side wires are arranged, the upper power electrode 240S may be also provided in a portion z10-2 of at least one side where the side wires are not formed. That is, the upper power electrode 240S may be arranged in the outer area 'NAA' of the LED module 110 where the side wiring structure is not formed.

Figure 10:
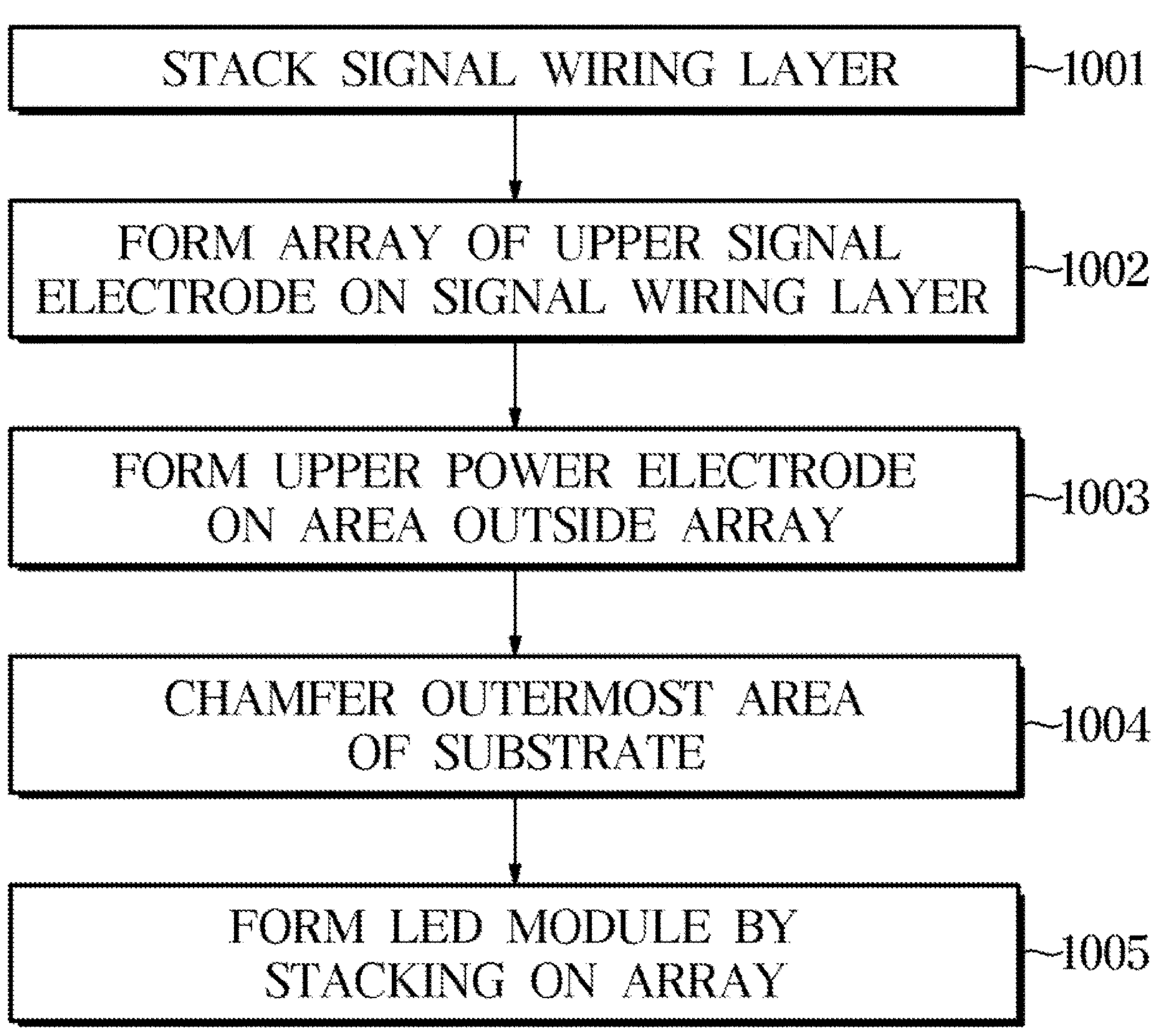
FIG. 10 is a flowchart of a method of manufacturing an LED, according to an embodiment.

FIG. 10 is a flowchart of a method of manufacturing an LED, according to an embodiment.

First, a signal wiring layer may be stacked on the glass, in 1001.

An array of upper signal electrodes may be formed in the signal wiring layer, in 1002. The array may be provided in rows and columns of upper signal electrodes on the glass. An upper power electrode 240S may be formed in an area outside the array on the substrate, in 1003. An outermost part of the substrate may be chamfered and the upper power electrode 240S may be provided as a protruding portion (projection), in 1004.

An LED module may be formed by stacking an LED and other layers on the array, in 1005.

While certain embodiments been shown and described, it will be understood by those skilled in the art that various changes in form and details may be made therein without departing from the spirit and scope of the disclosure as defined by the appended claims and their equivalents.

What is claimed is:

1. A light emitting diode (LED) module comprising:

a substrate;

a plurality of first electrodes arranged on a top surface of the substrate;

a second electrode provided on the top surface of the substrate among the plurality of first electrodes; and an LED electrically connected to the plurality of first electrodes, wherein the second electrode comprises a protruding portion extending obliquely from the top surface of the substrate to a first height in a second area, wherein the first height of the protruding portion of the second electrode is higher than second heights of the plurality of first electrodes, wherein the substrate comprises a signal wiring layer comprising a lower signal electrode and a lower power electrode, wherein the plurality of first electrodes are electrically connected to the lower signal electrode, and wherein the second electrode is electrically connected to the lower power electrode.

2. The LED module of claim 1, wherein the plurality of first electrodes are arranged in an array in a first area on the top surface of the substrate, and wherein the second electrode is provided in the first area and in the second area on the top surface of the substrate, the second area being outside the first area.

3. The LED module of claim 2, wherein the first height of the protruding portion is lower than or equal to a height of the LED.

4. The LED module of claim 3, wherein the protruding portion of the second electrode protrudes in the second area so as to form a continuous outer boundary with a corner of the substrate by being aligned with the corner of the substrate.

5. The LED module of claim 1, wherein the plurality of first electrodes are arranged in a two-dimensional array on the top surface of the substrate, and wherein the second electrode has a mesh form on the top surface of the substrate.

6. The LED module of claim 1, wherein the substrate has a rectangular form having four sides surrounding the top surface and a bottom surface of the substrate, wherein the substrate comprises side wires provided on at least one side among the four sides of the substrate to electrically connect electrodes arranged on the top surface and the bottom surface of the substrate, and wherein the second electrode is provided among the plurality of first electrodes and the side wires.

7. The LED module of claim 1, wherein a capacitance of the second electrode is greater than a capacitance of an entire set of the plurality of first electrodes.

8. A light emitting diode (LED) module comprising:

a substrate;

a plurality of first electrodes arranged in an array on a top surface of the substrate;

a second electrode provided among the array of the plurality of first electrodes on the top surface of the substrate; and an LED electrically connected to the plurality of first electrodes, wherein the second electrode comprises a protruding portion extending obliquely from the top surface of the substrate to a first height in an area outside the array, wherein the first height of the protruding portion is higher than a second height of the plurality of first electrodes and lower than or equal to a height of the LED, wherein the substrate comprises a signal wiring layer comprising a lower signal electrode and a lower power electrode, wherein the plurality of first electrodes are electrically connected to the lower signal electrode, and wherein the second electrode is electrically connected to the lower power electrode.

9. The LED module of claim 8, wherein the protruding portion of the second electrode protrudes and is arranged in the area outside the array so as to form a continuous outer boundary with a corner of the substrate by being aligned with the corner of the substrate.

10. The LED module of claim 8, wherein the substrate is provided in a rectangular form having four sides surrounding the top surface and a bottom surface of the substrate, wherein the substrate comprises side wires arranged at least one side among the four sides of the substrate to electrically connect electrodes arranged on the top surface and the bottom surface of the substrate, and wherein the second electrode is provided among the plurality of first electrodes and the side wires.

11. The LED module of claim 8, wherein a capacitance of the second electrode is greater than a capacitance of an entire set of the plurality of first electrodes.

12. A light emitting diode (LED) module comprising:

a substrate;

a plurality of first electrodes two-dimensionally arranged on a top surface of the substrate;

a second electrode provided in a mesh form among the plurality of first electrodes on the top surface of the substrate; and an LED electrically connected to the plurality of first electrodes, wherein the second electrode comprises a protruding portion extending obliquely from the top surface of the substrate to a first height in a second area, and wherein the first height of the protruding portion of the second electrode is higher than second heights of the plurality of first electrodes.

13. The LED module of claim 12, wherein the plurality of first electrodes are arranged in an array in a first area on the top surface of the substrate, and wherein the second electrode is provided in the first area and the second area on the top surface of the substrate, the second area being outside the array.

* * * * *